United States Patent [19]

Ueno et al.

[11] Patent Number: 5,184,399
[45] Date of Patent: Feb. 9, 1993

[54] METHOD OF MANUFACTURING CIRCUIT BOARD

[75] Inventors: Fumio Ueno, Yokohama; Mitsuo Kasori, Kawasaki; Yoshiko Goto, Tokyo; Akihiro Horiguchi, Kawasaki, all of Japan

[73] Assignee: Kabushiki Kaisha Toshiba, Kawasaki, Japan

[21] Appl. No.: 723,184

[22] Filed: Jun. 28, 1991

[30] Foreign Application Priority Data

Jun. 29, 1990 [JP] Japan .................... 2-169918

[51] Int. Cl.⁵ .............................. H05K 3/00
[52] U.S. Cl. ................................ 29/846; 29/848
[58] Field of Search ............... 29/825, 829, 846, 847, 29/848, 849; 156/58, 59, 61, 63

[56] References Cited

U.S. PATENT DOCUMENTS

| | | | |
|---|---|---|---|
| 2,585,700 | 2/1952 | Strickman | 29/846 X |
| 3,247,573 | 4/1966 | Noack | 29/848 |
| 3,753,816 | 8/1973 | Feldstein | 29/847 X |
| 3,947,956 | 4/1976 | Leroux et al. | 29/847 X |
| 4,176,443 | 12/1979 | Iannuzzi et al. | 29/846 X |
| 4,546,065 | 10/1985 | Amendola et al. | 29/848 X |
| 4,591,537 | 5/1986 | Aldinger et al. | |
| 4,649,070 | 3/1987 | Kondo et al. | |
| 4,659,611 | 4/1987 | Iwase et al. | |
| 4,770,953 | 9/1988 | Horiguchi et al. | |
| 4,882,839 | 11/1989 | Okada et al. | 29/846 X |

FOREIGN PATENT DOCUMENTS

| | | | |
|---|---|---|---|
| 65970 | 6/1978 | Japan | 29/846 |
| 63-179734 | 7/1988 | Japan . | |
| 95588 | 4/1989 | Japan | 29/849 |

OTHER PUBLICATIONS

IBM Technical Disclosure Bulletin, Subsurface Circuitry on Polymeric Substrates, Oct. 1984.

Primary Examiner—Timothy V. Eley
Attorney, Agent, or Firm—Oblon, Spivak, McClelland, Maier & Neustadt

[57] ABSTRACT

Disclosed is a method of manufacturing a circuit board comprising an insulating substrate and a conductor pattern of a low resistivity which can be prevented from being peeled off the substrate by a thermal stress. The method comprises the step of forming an insulating layer on an insulating substrate, the insulating layer being provided with a groove having a depth of at least 20 μm and shaped like a conductor pattern which is to be formed later, the step of filling the groove of the insulating layer with a paste composition consisting of a powdery material capable of forming an electrically conductive metal, a fine particles having a thermal expansion coefficient smaller than that of the electrically conductive metal, the fine particles being used in an amount of 0.5 to 20% by volume based on the amount of the electrically conductive metal, and an organic binder, and the step of baking the paste composition so as to form a conductor pattern on the insulating substrate, the conductor pattern containing as a main component the electrically conductive metal and the fine particles having a thermal expansion coefficient smaller than that of the metal, the fine particles being dispersed in the electrically conductive metal in an amount of 0.5 to 20% by volume based on the amount of the electrically conductive metal.

16 Claims, 4 Drawing Sheets

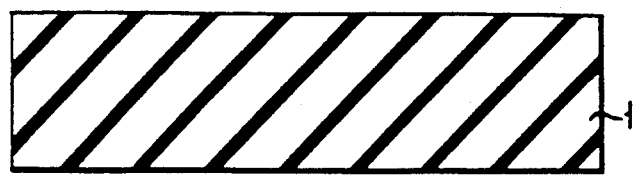
F I G. 4A
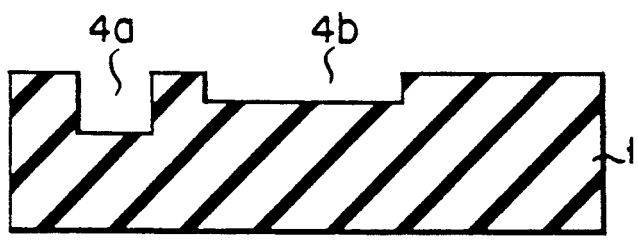
F I G. 4B
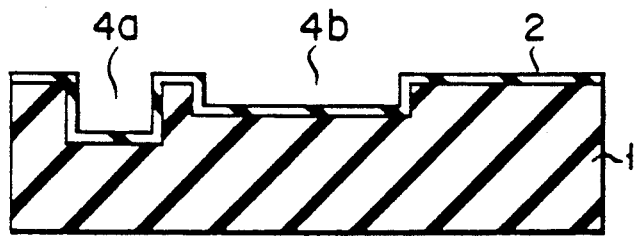
F I G. 4C
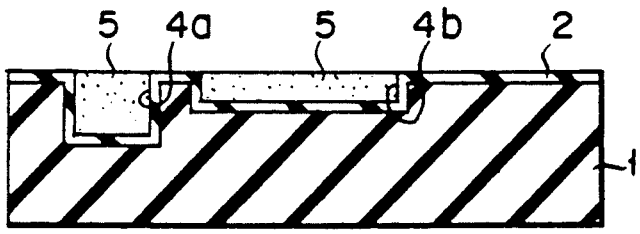
F I G. 4D

METHOD OF MANUFACTURING CIRCUIT BOARD

BACKGROUND OF THE INVENTION

1. Field of the Invention

The present invention relates to a method of manufacturing a circuit board and to a circuit board itself manufactured by said method. Particularly, the present invention provides a method of manufacturing a circuit board using an insulating substrate having a high thermal conductivity, said circuit board being used for mounting a semiconductor element, and the circuit board itself manufactured by the particular method.

2. Description of the Related Art

In the manufacture of a circuit board, metallizing is applied in general to a part or the entire surface region of an insulating substrate formed of, for example, aluminum nitride sintered body, alumina or glass, in an attempt to form a conductor pattern or to achieve a satisfactory bonding with a foreign metal.

Various methods of metallizing the surface of an insulating substrate are known to the art including, for example, a method utilizing a metal having a high melting point, an active metal bonding method, a co-firing method, a method of forming a thick film circuit, a thin film forming method, and a direct bond copper (DBC) method. In the manufacture of a circuit board by the direct bond copper method, a copper plate of a circuit shape is bonded to the surface of the insulating substrate so as to form a conductor pattern. Table 1 shows the resistivity, and ratio of minimum circuit width/distance of the conductor patterns formed by the conventional metallizing methods exemplified above.

TABLE 1

| Process | Material | Resistivity ($m\Omega/mm^2$) | W/D Ratio* |
|---|---|---|---|
| Metallizing of high melting point metal | Mo + Mn etc. | 10 or less | 0.2 mm or less |
| Active metal metallizing method etc. | Ti, Ni | 10 or less | 0.3 mm or less |
| Co-firing method | W, Mo | 10 or less | 0.2 mm or less |
| Thick film method | Cu etc. | less than 3 | 0.1 mm or less |
| Thin film | Cu | $0.2\ \Omega/mm^2$ | 0.1 mm or less |
|  | Au | $0.3\ \Omega/mm^2$ | 0.1 mm or less |
| DBC method | Cu; $8.5 \times 10^{-5}\ \Omega/mm^2$ |  | 0.5 mm |

In many cases, a semiconductor element is mounted to the circuit board of the type described above. In recent years, a marked progress is being made in the integration density, allowable operating power, operating speed, etc. of a semiconductor element. In accordance with the progress, the total heat generation and the heat generation per unit area of the semiconductor element are on a sharp increase. To cope with the increased heat generation, an insulating substrate formed of a material having a high thermal conductivity, e.g., aluminum nitride sintered body, or a silicon carbide sintered body, is being developed and put to a practice use. A circuit board comprising an insulating substrate formed of a material having a high thermal conductivity such as an aluminum nitride sintered body or a silicon carbide sintered body produces a prominent effect. Specifically, it is possible to conduct a large current through the semiconductor element mounted on the insulating substrate because the substrate permits an excellent heat dissipation. However, in the case of forming a conductor pattern of a small width and a small distance between adjacent conductive regions on the surface of the insulating substrate by the conventional metallizing methods such as the co-firing method, the conductor pattern exhibits a relatively high resistivity, as shown in Table 1. As a result, various difficulties are brought about in the case of conducting a large current through the semiconductor element mounted on the substrate. For example, in the case of forming a conductor pattern 0.5 mm wide and 20 mm long on the surface of the insulating substrate, the conductor pattern formed by any of the conventional metallizing methods exemplified above exhibits a resistance of 1 to 0.1 $\Omega$. It follows that a voltage drop of 2 to 20 mV takes place in the case of conducting a current of 20 mA through a signal line of 2 V. The voltage drop noted above is as large as 0.1 to 1% of the signal line voltage. Also, when it comes to a circuit board having a power transistor of 500 V mounted on a conductor pattern having a width of 5 mm and a length of 20 mm, a power of 0.1 to 1 W is consumed uselessly in the case of conducting a current of 10 A.

It is certainly possible to lower the resistivity of the conductor pattern when it comes to a circuit board manufactured by employing the direct bond copper method, or a circuit board prepared by metallizing the surface of an insulating substrate by means of the active metal bonding method, followed by forming a conductor pattern by bonding a metal pate or foil of a circuit shape on the metallized surface of the substrate by means of soldering or brazing. Naturally, it is possible to conduct a large current through the semiconductor element mounted on such a substrate. However, the particular methods exemplified above require the step of processing in advance a copper plate in a circuit shape, leading to a complex manufacturing process. Also, it is difficult to form a conductor pattern of a high dimensional accuracy. In addition, problems such as a thermal expansion and a thermal deformation are brought about in the bonding step. Under the circumstances, it is difficult to form a conductor pattern on the surface of an insulating substrate with a high density, when it comes to the conventional metallizing methods. As a matter of fact, it is substantially impossible to make the conductor pattern finer than 0.5 mm in both the width and distance in the conventional metallizing methods.

Also proposed is a method in which a copper plate is bonded to a substrate surface by the direct bond copper method, followed by applying a chemical etching or electrolytic etching to the copper plate so as to form a fine conductor pattern. However, this technique is defective in that much time is required for the corrosion of the insulating substrate and for the after-treatment.

An additional difficulty remains unsolved in the case of a circuit board prepared by the direct bond copper method or a circuit board prepared by bonding a metal plate or foil of a circuit shape to the surface of an insulating substrate metallized by the active metal bonding method. Specifically, the conductor pattern of such a circuit board has a relatively large thickness, i.e., 0.1 mm or more, with the result that the circuit board bears a residual thermal stress derived from the difference in the thermal expansion coefficient between the conductor pattern and the insulating substrate. As a result, cracking tends to take place at the interface between the insulating substrate and the conductor pattern, particularly, in the insulating substrate in the vicinity of the edge portion of the conductor pattern or in the bonding interface. To be more specific, the thermal stress applied to the interfacial region between the insulating substrate and the conductor pattern is alleviated by the temperature change in the step of bonding a metal member such as a semiconductor element, a lead wire or a seal ring to the conductor pattern or by the thermal history during the use of the semiconductor element. As a result, cracking tends to take place at the bonding interface. A similar problem also takes place in the step of applying a reliability accelerating test or TCT (thermal cycle test) to the semiconductor element mounted to the circuit board. It has been confirmed that the difficulty becomes serious with increase in the thickness of the conductor pattern. In the case of a circuit board utilizing a combination of, for example, a copper plate and an aluminum nitride substrate, it was practically impossible in the conventional technique to make the copper plate thicker than 0.3 mm.

On the other hand, Published Unexamined Japanese Patent Application No. 63-179734 discloses a circuit board comprising a substrate formed of, for example, an aluminum nitride sintered body having a high thermal conductivity, an active metal layer formed on the surface of the substrate, and a copper-based alloy member formed on the active metal member and having a porosity of at most 10% by volume. In the circuit board disclosed in this prior art, however, it is necessary to process in advance the copper-based alloy plate in a circuit shape, leading to a complex manufacturing process of the circuit board. In addition, it is difficult to form a circuit pattern of a high dimensional accuracy.

SUMMARY OF THE INVENTION

An object of the present invention is to provide a method of manufacturing a circuit board comprising an insulating substrate and a conductor pattern of a low resistivity having a thickness of, for example, at least 20 $\mu$m and formed on the substrate surface with a high density, the difference in thermal expansion coefficient between the insulating substrate and the conductor pattern being small, and a thermal stress accompanying the above-noted difference in thermal expansion coefficient being small, so as to prevent the conductor pattern from peeling from the substrate. The present invention also provides a circuit board manufactured by the particular method.

According to the present invention, there is provided a method of manufacturing a circuit board, comprising:
the step of preparing an insulating substrate provided with a groove shaped like a conductor pattern to be formed on said substrate; and
the step of forming a conductor pattern in said groove, said conductor pattern containing as a main component an electrically conductive metal and fine particles having a thermal expansion coefficient smaller than that of said electrically conductive metal or cells.

To be more specific, the method of the present invention for manufacturing a circuit board comprises:
the step of forming a layer on an insulating substrate, said layer being provided with a groove shaped like a conductor pattern which is to be formed later;
the step of filling the groove of the layer with a paste composition consisting of a powdery material capable of forming an electrically conductive metal, fine particles having a thermal expansion coefficient smaller than that of the electrically conductive metal, and an organic binder; and
the step of baking the paste composition so as to form a conductor pattern on the insulating substrate, said conductor pattern containing as a main component the electrically conductive metal and the fine particles having a thermal expansion coefficient smaller than that of the metal, said fine particles being dispersed in the electrically conductive metal.

Figs. 1A to 1D collectively show a method according to the present invention. As shown in FIG. 1A an insulating substrate 1 is prepared in the first step. Where the insulating substrate 1 is formed of a non-oxide material, e.g., aluminum nitride, a heat treatment is applied to the substrate under an oxidizing atmosphere so as to form an oxide film 2 on the surface of the substrate 1. Then, a resist layer 3, which is a layer, is formed on the oxide film 2, as shown in FIG. 1B, followed by selectively removing the resist layer 3 by means of, for example, a photoetching technique so as to form a plurality of grooves 4 each having a depth of at least 20 $\mu$m.

The grooves 4 thus formed are filled in the next step with a paste composition 5 consisting of a powdery material capable of forming an electrically conductive metal, fine particles having a thermal expansion coefficient smaller than that of the electrically conductive metal, and an organic binder, as shown in FIG. 1C. Then, the paste composition 5 is baked. As a result, a circuit board is formed including a conductor pattern 7, as shown in FIG. 1D. It should be noted that the conductor pattern 7 is substantially equal in size to the groove 4. Also, a eutectic layer 6 is formed where the oxide film on the surface of the substrate. 1 is interposed between the substrate surface and the conductor pattern 7 so as to permit a strong bonding of the conductor pattern 7 to the substrate 1. It should also be noted that the remaining resist layer 3 is burned away in the baking step for forming the conductor pattern.

The insulating substrate 1 is formed of an inorganic material or a complex material containing an inorganic material and a metallic material. Also, the material of the insulating substrate 1 may be of a single component system or a multi-component system. Further, a single crystalline material, glass, a mixture of glass and another material, or a ceramic sintered body may be used for forming the insulating substrate. The specific materials used for forming the insulating substrate 1 include, for example, alumina, beryllia, forstelite, steatite, silicon carbide, aluminum nitride, silicon nitride, mullite, titania, various glasses, glass complex materials such as alumina-glass combination, a metallic enamel material, and a cubic single crystal of boron nitride. Particularly, it is desirable to use a single crystalline material, a polycrystalline material or a combination thereof, which contains as a main component at least one material selected from the group consisting of aluminum nitride, silicon carbide, diamond, cubic boron nitride, silicon nitride, boron phosphide (BP), deryllia and alumina. It is more desirable to use an aluminum nitride sintered body having a thermal conductivity of at least 170 W/m k as measured by a laser flush method. The polycrystalline material noted above can be obtained by, for example, sintering under an atmospheric pressure, synthesis under a high pressure, sintering under a pressurized atmosphere, sintering under a uniaxial pressurizing, or a reaction sintering. In the manufacture of the sintered body, it is possible to use a sintering aid. It is also possible to apply a purifying treatment by the method disclosed in, for example, U.S. Pat. No. 4,847,221. Further, a polycrystalline material manufactured without using a sintering aid can also be used for forming the insulating substrate 1 included in the circuit board of the present invention.

As described previously, an oxide film is formed on the surface of the insulating substrate by means of a heat treatment under an oxidizing atmosphere. Alternatively, it is also possible to form a coating film of, for example, a metal alkoxide, followed by thermally decomposing the metal alkoxide film so as to form the desired oxide film on the substrate surface.

In the present invention, the depth of the groove 4 formed in the layer 3 is desired to be at least 20 μm. It should be noted that the conductor pattern formed in the present invention has a resistivity lower than that of a conductor pattern formed by a thick film-forming technique. Thus, in the present invention, the lower limit of the depth of the groove is desired to be 20 μm, which is equal to the critical thickness achieved by the thick film-forming technique. More desirably, the depth of the groove 4 should be at least 60 μm.

As described previously, the groove 4 is formed by selectively removing the resist layer 3 by means of a photoetching technique. Alternatively, it is possible to employ the technique shown in FIG. 2. Specifically, an insulating layer 8 consisting of, for example, silicon oxide, silicon nitride or the like is formed on the entire surface of the insulating substrate 1, followed by selectively etching the insulating film 8 by means of, example, a photoetching technique, with a resist pattern used as a mask, so as to form the groove 4. It should be noted that the remaining insulating film 8 is left unremoved on the substrate 1 in this case even after the subsequent baking step for forming a conductor pattern.

the powdery material contained in the paste composition 5 includes, for example, copper, silver, gold, copper oxide and sliver oxide.

The paste composition 5 also contains fine particles of a material having a thermal expansion coefficient smaller than that of the electrically conductive metal, including, for example, at leas one ceramic material selected from the group consisting of aluminum nitride, silicon carbide, diamond, cubic boron nitride, silicon nitride, boron phosphide, beryllia and alumina. Alternatively, a metal having a high-melting point can also be used in the form of fine particles contained in the paste composition. Particularly, it is desirable to use fine particles of a material equal to the material of the insulating substrate or to the main component of the insulating substrate. It is also desirable to use fine particles of the oxide of the cation constituting the main component of the insulating substrate. For example, where the insulating substrate contains aluminum nitride as a main component, it is desirable for fine particles of aluminum nitride or aluminum oxide to be uniformly dispersed in the past composition. The particle diameter of these fine particles should desirably fall within a range of between 0.1 and 5 μm in view of dispersion capability, electrical resistance and reliability.

In the present invention, the amount of the fine particles of the particular material are preferably 0.5 to 20% by volume based on the amount of the electrical conductive metal. If the amount of the fine particles is smaller than 0.5% by volume, it is difficult to allow a conductor pattern formed in the subsequent step to have a thermal expansion coefficient close to that of the insulating substrate. On the other hand, if the amount noted above exceeds 20% by volume, it is difficult to form a conductor pattern of a sufficiently low resistivity because the resistivity of the fine particles, which are used in such a large amount, is higher than that of the electrically conductive metal.

As described previously, the groove formed in the insulating layer is filled with the paste composition, followed by baking the paste composition so as to form a conductor pattern. Alternatively, it is possible to form an insulating layer consisting of, for example, silicon oxide or silicon nitride, on the oxide film covering the substrate surface, followed by selectively removing the insulating layer so as to form grooves. These grooves are loaded with the paste composition with a clearance left between the side well of the groove and the edge of the paste composition. In this case, the clearance noted above is filled in the subsequent step with a synthetic resin paste, followed by baking the paste composition so as to form a conductor pattern. As shown in FIG. 3, a synthetic resin layer 9 is formed between the side wall of the groove 4 formed in the insulating layer 8 and the conductor pattern 7 in the alternative method described above.

The baking should be carried out at a temperature of at least 600° C., preferably at 1066 and 1085° C. under an inert atmosphere such as an argon gas or nitrogen gas atmosphere. However, where copper oxide or silver oxide is used as an electrically conductive metal-forming material contained in the paste composition 5, the baking treatment should be carried out under a reduction atmosphere such as a forming gas atmosphere prepared by mixing a hydrogen gas and a nitrogen gas.

The present invention also provides a method of manufacturing a circuit board, comprising:

the step of forming a groove in an insulating substrate, said groove shaped like a conductor pattern which is to be formed later;

the step of filling the groove of the substrate with a paste composition consisting of a powdery material capable of forming an electrically conductive metal, fine particles having a thermal expansion coefficient smaller than that of the electrically conductive metal, and an organic binder; and the step of baking the paste composition so as to form a conductor pattern on the insulating substrate, said conductor pattern containing as a main component the electrically conductive metal and the fine particles having a thermal expansion coefficient smaller than that of the metal, said fine particles being dispersed in the electrically conductive metal.

FIGS. 4A to 4E collectively show in detail the particular method of manufacturing the circuit board of the present invention summarized above. In the step, an insulating substrate 1 is prepared, as shown in FIG. 4A Then, the surface region of the insulating substrate 1 is selectively removed so as to form a plurality of grooves 4a and 4b differing from each other in depth and having a depth of, for example, at least 20 μm, as shown in FIG. 4B. Where the insulating substrate is formed of a non-oxide material, e.g., aluminum nitride, a heat treatment is applied under an oxidizing atmosphere so as to form an oxide film 2 covering the surface of the substrate 1 and the side walls of the grooves 4a, 4b, as shown in FIG. 4C.

In next step, the grooves 4a and 4b are filled with a paste composition 5 consisting of a powdery material capable of forming an electrically conductive metal, fine particles having a thermal expansion coefficient smaller than that of the electrically conductive metal, and an organic binder, as shown in FIG. 4D. The amount of the fine particles are preferably 0.5 to 20% by volume based on the amount of the electrically conductive metal. Then, the paste composition is baked under the conditions similar to those described previously in conjunction with the process shown in FIGS. 1A to 1D so as to manufactured a circuit board provided with conductor patterns 7a and 7b, as shown in FIG. 4E. As in the manufacturing method described previously, ]hose portions of the oxide film 2 which are in direct contact with the conductor patterns are converted into eutectic layers 6 so as to improve the bonding strength between the conductor patterns and the insulating substrate.

In forming the grooves 4a and 4b in the insulating substrate 1, a resist film is formed first on the entire surface of the substrate, followed by selectively removing the resist film by means of, for example, a photo-etching method so as to form a resist pattern. Then, the substrate surface is subjected to a selective dry etching treatment with the resist pattern used as a mask so as to form the desired grooves 4a and 4b. Alternatively, the substrate surface region may be directly removed selectively by means of a laser etching, a mechanical processing, or the like so as to form the desired grooves 4a, 4b.

In forming the conductor patterns, it is possible to load the paste composition 5 in the grooves 4a, 4b formed in the substrate 1 such that a desired clearance is provided between the side wall of the groove and the edge of the paste composition, as shown in FIG. 5.

Still another method of the present invention for manufacturing a circuit board comprises:

the step of forming a layer provided with a groove having a depth of, for example, at least 20 μm and shaped like a conductor pattern to be formed later in an insulating substrate, or the step of forming said groove directly in said substrate;

the step of depositing an electrically conductive film having cells dispersed therein by, for example, a CVD method by using as a raw material gases of compounds containing an electrically conductive metal selected from the group consisting of copper, silver and gold such as a copper halide or bisacetylacetonate copper (II) complex compound represented by the general formula given below:

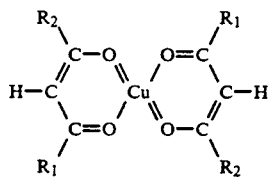

where $R_1$ and $R_2$, which are the same or different, denote hydrogen, alkyl or fluoroalkyl, the step of etching back the electrically conductive film deposited by the CVD method outside the groove so as to permit the deposited electrically conductive film to remain only within the groove; and the step of applying a sintering treatment at 600° C. or more, preferably, at 1066 to 1085° C. under an inert atmosphere such as a rare gas atmosphere like an argon gas atmosphere or a nitrogen gas atmosphere so as to form a conductor pattern bonded to the insulating substrate.

The CVD method used for forming an electrically conductive film includes, for example, thermal decomposition CVD method, thermal migration CVD method, laser decomposition CVD, plasma CVD method, ECR plasma CVD method and MOCV method.

The conductor region which is bonded to a semiconductor element by a die bonding method may also be provided by the conductor pattern formed by the particular method of the present invention. Also, the conductor region bonded to a semiconductor element by the die bonding method may be provided by the DBC method, a conductor prepared from a metallized layer formed on the substrate, or a conductor prepared by covering the surface of the metallized layer with a nickel or gold film by means of plating or PVD method.

FIG. 6 shows the construction of a circuit board having a semiconductor element mounted thereon As seen from the drawing, a plurality of grooves 12 are formed in the surface region of an insulating substrate 11. A conductor pattern 13 is buried in each of the grooves 12. It should be noted that a eutectic layer 14 with an oxide film formed on the surface of the substrate is formed in the contact region between the conductor pattern 13 and the substrate 11. A plurality of copper conductors 15 are bonded by, for example, the DBC method to the substrate surface regions except for the regions of the conductor patterns 13. The eutectic layer 14 is also formed in the contact region between the substrate 11 and the copper conductor 15. A solder layer 16 is formed on the surface of each of the copper conductors 15. Also, a semiconductor element 17 is bonded to the solder layer 16 by the die bonding method. An electrode pad (not shown) is mounted on the upper surface of each of the semiconductor elements 17. A wire 18 is connected at one end to the electrode pad and to the conductor pattern 13 at the other end. Further, a conductor 19 is bonded to the lower surface of the substrate 11 with a eutectic layer interposed therebetween.

As described above, a layer provided with a groove having a depth of, for example, at least 20 μm is formed on the surface of an insulating substrate in the method of the present invention. Alternatively, a groove having a depth of, for example, at least 20 μm is formed directly in the surface region of an insulating substrate. A paste composition containing a powdery material capable of forming an electricaly conductive material is loaded into the groove, followed by baking the paste composition so as to form a fine conductor pattern at a high density. It is important to note that the conductor pattern is mechanically coupled with the insulating substrate. Also, a eutectic layer is interposed between the conductor pattern and the substrate. The particular method of the present invention makes it possible to form a conductor pattern having a thickness of at least 20 μm, and each of a width and a clearance between the adjacent conductor layers of 0.5 mm or less. It should also be noted that 0.5 to 20% by volume of fine particles are dispersed in the conductor pattern, with the result that the conductor pattern is enabled to exhibit a thermal expansion coefficient close to that of the insulating substrate. It follows that a difficulty derived from the difference in the thermal expansion coefficient between the conductor pattern and the insulating substrate need not be worried about regardless of the heat cycle accompanying the wire bonding step, TCT test or actual operation of the semiconductor device. To be more specific, it is possible to prevent cracking or the like from being caused in the vicinity of the bonding interface by the thermal stress derived from the difference in the thermal expansion coefficient noted above. As a result, it is possible to make the conductor pattern thicker than the critical value, i.e., 20 μm, in the case of a thick-film printing technique.

In another embodiment of the present invention, an electrically conductive metal layer is deposited on the surface of an insulating substrate provided with patterned grooves by means of for example CVD method using as the raw material gases of compounds containing a metal selected from the group consisting of copper, silver and gold such as a copper halide, bis-acetyl acetonate copper (II) complex and derivatives thereof, followed by etching back the deposited metal layer such that metal layer is left unremoved only within the patterned grooves. It is also possible to form a layer provided with patterned grooves on the insulating substrate. In this case, the electrically conductive metal layer is formed to fill the grooves formed in said layer by, for example, CVD method as described above. After formation of the metal layer within the grooves, the metal layer is sintered to achieve an eutectic coupling between the metal layer and the substrate. The particular method also permits forming a fine conductor pattern with a high density. Also, the conductor pattern is bonded to the substrate by means of both mechanical coupling and eutectic coupling. In addition, cells are dispersed in the conductor pattern, with the result that the conductor pattern is enabled to exhibit a thermal expansion coefficient close to that of the insulating substrate. It follows that a difficulty derived from the difference in the thermal expansion coefficient between the conductor pattern and the insulating substrate need not be worried about regardless of the heat cycle accompanying the wire bonding step, TCT test or actual operation of the semiconductor device. To be more specific, it is possible to prevent cracking or the like from being caused in the vicinity of the bonding interface by the thermal stress derived from the difference in the thermal expansion coefficient noted above. As a result, it is possible to make the conductor pattern thicker than the critical value, i.e., 20 μm, in the case of a thick-film printing technique.

In conclusion, the method of the present invention permits manufacturing a circuit board comprising a high density of a conductor pattern of a low resistivity ranging between $1.7 \times 10^{-6}$ Ωcm and $3.6 \times 10^{-6}$ Ωcm, or at most $1 \times 10^{-5}$ Ωcm. Naturally a relatively large current can be conducted through the conductor pattern. What should also be noted is that the circuit board manufactured by the method of the present invention can be used for preparing a hybrid IC or a composite circuit board. Specifically, a resistor, a capacitor and a plurality of semiconductor elements are simultaneously formed on or mounted to the circuit board manufactured by the method of the present invention, followed by interconnecting the semiconductor elements and connecting the semiconductor elements to the external terminals by utilizing the conductor pattern included in the circuit board, so as to prepare a desired hybrid IC or a composite circuit board.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments serve to explain the principles of the invention.

FIGS. 4A to 4E are cross sectional views collectively showing a method of manufacturing a circuit board according to another embodimetn of the present invention;

DETAILED DESCRIPTION OF THE PREFERRED EMBODIMENTS

Described below are some Examples of the present invention.

EXAMPLE 1

Two sheets each having a thickness of 400 μm were prepared by a doctor blade method from a powdery mixture consisting of an aluminum nitride powder containing 1.0% by weight of an impurity oxygen and having an average primary particle diameter of 0.6 μm and 3% by weight of yttria ($Y_2O_3$) powder having an average particle diameter of 0.1 μm and a purity of 99.9%. A laminate structure of these sheets was heated at 80° C. for 40 minutes under a pressure of 150 kgf/cm², followed by cutting the laminate to prepare pieces each sized at 25 mm square. The cut pieces were heated up to 600° C. under a nitrogen gas stream so as to remove a binder contained in the cut pieces. Then, the cut pieces were heated at 1800° C. for 3 hours within an electric furnace made of carbon so as to obtain aluminum nitride substrates each sized 20 mm square and 0.635 mm thick. The heating was carried out under a nitrogen gas atmosphere of atmospheric pressure. The thermal conductivity of the substrate, which was measured by a laser flush method, was found to be 200 W/m·k.

Figure 1A:
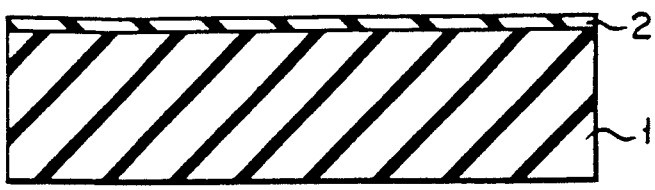
FIGS. 1A to 1D are cross sectional views collectively showing a method of manufacturing a circuit board according to one embodiment of the present invention.
Figure 1B:
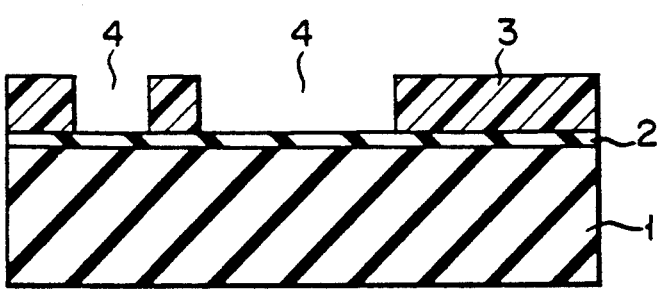
Figure 1C:
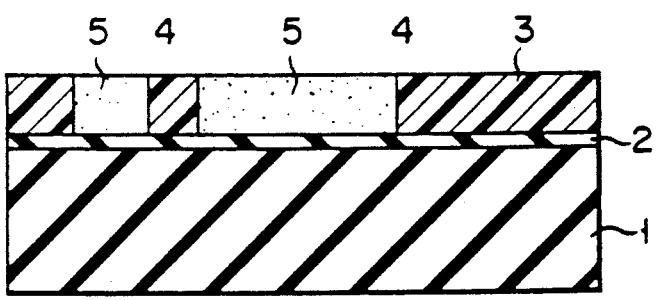
Figure 1D:
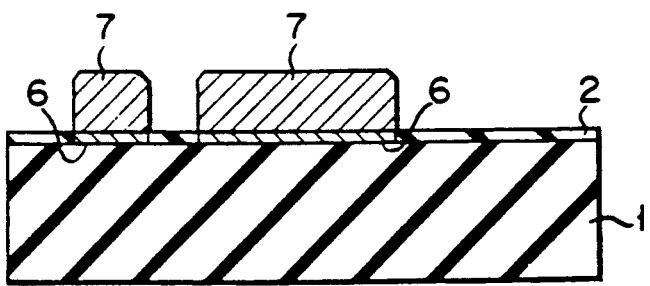
Figure 2:
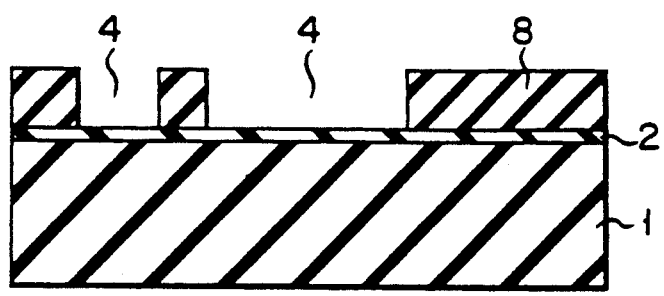
FIG. 2 is a cross sectional view showing another technique of forming and insulating layer provided with a groove in method of the present invention for manufacture a circuit board.
Figure 3:
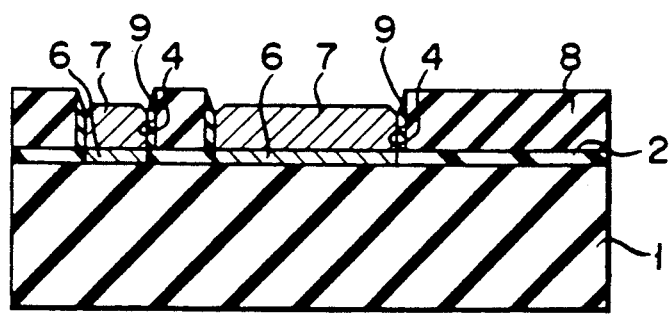
FIG. 3 is a cross sectional view showing a circuit board the method of the present invention.

In the next step, the aluminum nitride substrate was subjected to a heat treatment at 1100° C. under a dry air atmosphere so as to form an oxide film about 1.5 μm thick on the surface of the substrate. Then, the oxide film was coated with APR (trade name of a photosensitive resin for a letterpress printing manufactured by Asahi Kasei K.K.), followed by applying light exposure and development to the coating by using a negative film of a circuit pattern so as to form grooves. The groove formed in the resist layer (coating layer) by the exposure and development was found to have reached the oxide film formed on the surface of the aluminum nitride substrate like the structure shown in FIG. 1B. Also, the grooves were found to have a depth of 0.25 mm, a width of 2 mm, 1 mm, 0.5 mm, 0.25 mm, 0.10 mm, and a clearance between the adjacent conductor layers of 0.5 mm, 0.25 mm, and 0.1 mm. Further, a groove 5 mm square was formed in the central portion of the insulating substrate.

On the other hand, a paste composition was prepared by adding to a powdery copper having a particle diameter of 0.9 μm 3% by volume based on the amount of the powdery copper of an alumina powder having a particle diameter of 1.5 μm and 3% by weight based on the amount of the powdery copper of a 5% aqueous solution of PVA, followed by kneading the mixture to prepare the paste composition and subsequently passing the paste composition through a sieve of 200 meshes so as to granulate the paste composition. The resultant paste composition was pushed into the grooves formed in the resist layer positioned on the surface of the substrate. Then, the substrate was heated up to 700° C. under a forming gas atmosphere prepared by adding 0.04 g/l of steam to a mixed gas consisting of 2 parts of hydrogen gas and 9 parts of nitrogen gas so as to burn away the resist layer, followed by baking the substrate to 1070° under a nitrogen gas atmosphere containing 4 ppm of oxygen gas. As a result, accurately formed was a conductor pattern having a maximum thickness of about 0.13 mm and a width slightly greater than the width of the groove formed in the previous step. A cross section of the conductor pattern was observed with an electron microscope, and the conductor pattern was peeled off so as to measured the density by the Archimedean method. It has been found that the alumina powder was uniformly dispersed in the conductor pattern.

Evaluation tests given below were applied to 50 circuit boards manufactured by the method described above:

1. The electrical resistance of the conductor pattern was measured by a DC four terminal method. It has been found that the resistance per 18 mm of the conductor pattern was as low as only 0.3 mΩ in the thinnest portion of the conductor pattern in which the conductor pattern had a width of 0.103 mm and a cross sectional area of 0.012 mm². Of course, the resistivity of the conductor pattern was as low as desired in the present invention.

2. A nail consisting of a metal rod and a nail head 1.5 mm in diameter formed at the tip of the metal rod was soldered to the conductor pattern having the largest width, i.e., 2 mm. The metal rod was pulled upright so as to determine the bonding strength between the conductor pattern and the aluminum nitride substrate by measuring the tensile load required for peeling the conductor pattern from the aluminum nitride substrate. It has been found that the bonding strength was as high as 14.3±2.6 kg/cm², which is of no practical problem.

3. A solder layer was put on a conductor pattern about 5 mm square (conductor pad), which was formed in the central portion of the circuit board. Under this condition, the circuit board was put on a hot plate and heated under an inert gas atmosphere to a temperature higher than the melting point of the solder so as to fuse the solder layer. Then, a semiconductor element was put on the fused solder layer, followed by applying a planar scrubbing to permit the semiconductor element to be sufficiently wetted with the conductor pad of the circuit board so as to achieve soldering without involving bubbles. Further, the circuit board was taken out of the hot plate and cooled to room temperature so as to achieve die bonding of the semiconductor element. Still further, a plurality of electrode pad portions of the die-bonded semiconductor element were connected to a plurality of conductor patterns formed in a width of 0.25 mm on the circuit board and to a plurality of conductor patterns formed in a width of 2 mm on the circuit board by a plurality of aluminum wires by means of an ultrasonic bonder. Finally, a lead terminal was soldered to the edge portion of each of the conductor patterns on the side opposite to the wire connecting portion.

The resultant circuit board having a semiconductor element mounted thereon was subjected to a thermal cycle test ranging between +150° C. and −50° C. It has been found that cracking or peeling which can be recognized by the naked eye observation or microscopic observation was not found at all after the thermal cycle test of 1,000 cycles. Also, the semiconductor element mounted to the circuit board has been found not to give rise to any problem, which is brought about by the heat resistance of the circuit board. Since the circuit board of the present invention comprises a fine conductor pattern excellent in reliability and low in electrical resistance, the present invention permits providing a semiconductor device having a semiconductor element, to which a large current can be supplied, mounted on the circuit board.

EXAMPLES 2 and 3

Circuit boards were manufactured substantially as in Example 1, except that used in Example 2 was a paste composition prepared by adding to a powdery copper oxide ($Cu_2O$) having a particle diameter of 1.2 μm 3% by volume based on the amount of the copper oxide of an alumina powder having a particle diameter of 1.5 μm, and that used in Example 3 was a paste composition prepared by adding to a powdery copper having a particle diameter of 0.9 μm 3% by volume based on the amount of the powdery copper of an aluminum nitride powder.

Each of the conductor patterns included in the circuit boards thus manufactured was about 0.3 to 0.5 mm thick. It was possible to form with a high accuracy a conductor pattern of a width slightly larger than the width of the groove formed during the manufacturing process of the circuit board. A cross section of the conductor pattern was observed by an electron microscope. It was been found that the alumina powder of the aluminum nitride powder was uniformly dispersed in the conductor pattern.

Evaluation tests given below were applied to 50 circuit boards manufactured in each of Examples 2 and 3 by the method described above:

1. The electrical resistance of the conductor pattern was measured by a DC four terminal method. It has been found that the resistance per 18 mm of the conductor pattern was as low as only 0.33 to 0.42 mΩ in the thinnest portion of the conductor pattern in which the conductor pattern had a width of 0.09 mm and a cross sectional area of 0.003 mm². Of course, the resistivity of the conductor pattern was as low as desired in the present invention.

2. A nail consisting of a metal rod and a nail head 1.5 mm in diameter formed at the tip of the metal rod was soldered to the conductor pattern having the largest width, i.e., 2 mm. The metal rod was pulled upright so as to determine the bonding strength between the conductor pattern and the aluminum nitride substrate by measuring the tensile load required for peeling the conductor pattern from the aluminum nitride substrate. It has been found that the bonding strength was as high as 9 to 19 kg/cm$^2$, which is of no practical problem.

3. A solder layer was put on a conductor pattern about 5 mm square (conductor pad), which was formed in the central portion of the circuit board. Under this condition, the circuit board was put on a hot plate and heated under an inert gas atmosphere to a temperature higher than the melting point of the solder so as to fuse the solder layer. Then, a semiconductor element was put on the fused solder layer, followed by applying a planar scrubbing to permit the semiconductor element to be sufficiently wetted with the conductor pad of the circuit board so as to achieve soldering without involving bubbles. Further, the circuit board was taken out of the hot plate and cooled to room temperature so as to achieve die bonding of the semiconductor element. Still further, a plurality of electrode pad portions of the die-bonded semiconductor element were connected to a plurality of conductor patterns formed in a width of 0.25 mm on the circuit board and to a plurality of conductor patterns formed in a width of 2 mm on the circuit board by a plurality of aluminum wires by means of an ultrasonic bonder. Finally, a lead terminal was soldered to the edge portion of each of the conductor patterns on the side opposite to the wire connecting portion.

The resultant circuit board having a semiconductor element mounted thereon was subjected to a thermal cycle test ranging between +150° C. and −50° C. It has been found that cracking or peeling which can be recognized by the naked eye observation or microscopic observation was not found at all after the thermal cycle test of 1,000 cycles. Also, the semiconductor element mounted to the circuit board has been found not to give rise to any problem, which is brought about by the heat resistance of the circuit board. Since the circuit board of the present invention comprises a fine conductor pattern excellent in reliability and low in electrical resistance, the present invention permits providing a semiconductor device having a semiconductor element, to which a large current can be supplied, mounted on the circuit board.

EXAMPLES 4 AND 5

Prepared were a substrate, 20 mm square and 0.635 mm thick, consisting of a hexagonal single crystal of boron nitride, and another substrate, 20 mm square and 0.635 mm thick, consisting of a silicon nitride sintered body. Then, an oxide film was formed on the surface of the boron nitride substrate by coating the surface of the substrate by a spin coating method with an isopropylene solution of a partially hydrolyzed aluminum propoxide, followed by heating the coating at 400° C. On the the hand an oxide film was formed on the sintered silicon carbide substrate as in Example 1.

A conductor pattern and a conductor pad were formed on each of the substrate thus prepared, as in Example 1. It was possible to form with a high accuracy a conductor pattern, the maximum thickness being about 0.13 mm, of a width slightly larger than the width of the groove formed during the manufacturing process of the circuit board. A cross section of the conductor pattern was observed by an electron microscope. Also, the density of the conductor pattern, which was peeled off the substrate, was measured by the Archimedean method. It has been found that an alumina powder was uniformly dispersed in the conductor pattern.

Evaluation tests given below were applied to 50 circuit boards manufactured in each of these two cases by the method described above:

1. The electrical resistance of the conductor pattern was measured by a DC four terminal method. It has been found that the resistance per 18 mm of the conductor pattern was as low as only 0.28 to 0.374 mΩ in the thinnest portion of the conductor pattern in which the conductor pattern had a width of 0.103 mm and a cross sectional area of 0.012 mm$^2$. Of course, the resistivity of the conductor pattern was as low as desired in the present invention.

2. A nail consisting of a metal rod and a nail head 1.5 mm in diameter formed at the tip of the metal rod was soldered to the conductor pattern having the largest width, i.e., 2 mm. The metal rod was pulled upright so as to determine the bonding strength between the conductor pattern and the aluminum nitride substrate by measuring the tensile load required for peeling the conductor pattern from the aluminum nitride substrate. It has been found that the bonding strength was as high as 7 to 15 kg/cm$^2$, which is of no practical problem.

3. A solder layer was put on a conductor pattern about 5 mm square (conductor pad), which was formed in the central portion of the circuit board. Under this condition, the circuit board was put on a hot plate and heated under an inert gas atmosphere to a temperature higher than the melting point of the solder so as to fuse the solder layer. Then, a semiconductor element was put on the fused solder layer, followed by applying a planar scrubbing to permit the semiconductor element to be sufficiently wetted with the conductor pad of the circuit board so as to achieve soldering without involving bubbles. Further, the circuit board was taken out of the hot plate and cooled to room temperature so as to achieve die bonding of the semiconductor element. Still further, a plurality of electrode pad portions of the die-bonded semiconductor element were connected to a plurality of conductor patterns formed in a width of 0.25 mm on the circuit board and to a plurality of conductor patterns formed in a width of 2 mm on the circuit board by a plurality of aluminum wires by means of an ultrasonic bonder. Finally, a lead terminal was soldered to the edge portion of each of the conductor patterns on the side opposite to the wire connecting portion.

The resultant circuit board having a semiconductor element mounted thereon was subjected to a thermal cycle test ranging between +150° C. and −50° C. It has been found that cracking or peeling which can be recognized by the naked eye observation or microscopic observation was not found at all after the thermal cycle test of 1,000 cycles. Also, the semiconductor element mounted to the circuit board has been found not to give rise to any problem, which is brought about by the heat resistance of the circuit board. Since the circuit board of the present invention comprises a fine conductor pattern excellent in reliability and low in electrical resistance, the present invention permits providing a semiconductor device having a semiconductor element, to which a large current can be supplied, mounted on the circuit board.

EXAMPLE 6

A substrate consisting of a sintered aluminum nitride as in Example 1 was coated with "APR" (trade name of a photosensitive resin for a letterpress printing manufactured by by Asahi Kasei K.K.), followed by drying the coating so as to form a resist layer. Then, light exposure and development were applied to the resist layer by using a negative film of a circuit pattern so as to form grooves in the resist layer. The groove thus formed was found to have reached the aluminum nitride substrate 1. Also, the grooves were found to have a depth of 0.25 mm, a width of 2 mm, 1 mm, 0.5 mm, 0.25 mm, 0.1 mm, and a clearance between the adjacent conductor layers of 0.5 mm, 0.25 mm and 0.1 mm. Further, a single groove 5 mm square was formed in the central portion of the substrate. In the next step, the surface region of the substrate was selectively removed by a reactive ion etching using the remaining resist layer as a mask, so as to form grooves 0.1 mm deep in the substrate. Further, the resist layer was removed, followed by applying a heat treatment 1100° C. under a dry air atmosphere so as to form an oxide film abut 1.5 μm thick in a manner to cover the substrate surface and the side walls of the grooves, as illustrated in FIG. 4C.

On the other hand, a paste composition was prepared by adding to a powdery copper having a particle diameter of 0.9 μm 3% by volume based on the amount of the powdery copper of an alumina powder having a particle diameter of 1.5 μm and 3% by weight based on the amount of the powdery copper of a 5% aqueous solution of PVA. The mixture was kneaded and, then, passed through a sieve of 200 meshes so as to granulate paste composition. The paste composition thus prepared was pushed in the grooves formed in the substrate, followed by heating the substrate up to 700° C. under a forming gas atmosphere prepared by adding 0.04 g/l of steam to a mixed gas consisting of 2 parts of hydrogen gas and 9 parts of nitrogen gas so as to burn away the resist layer. Further, the substrate was baked at 1070° C. under a nitrogen gas atmosphere containing 4 ppm of oxygen gas. As a result, accurately formed was a conductor pattern having a thickness of about 0.05 to 1.0 mm and a width slightly larger than the width of the groove formed in the previous step. A cross section of the conductor pattern was observed by an electron microscope. Also, the density of the conductor pattern, which was peeled off the substrate, was measured by the Archimedean method. It has been found that an alumina powder was uniformly dispersed in the conductor pattern.

Evaluation tests given below were applied to 50 circuit boards manufactured as above by the method described above:

1. The electrical resistance of the conductor pattern was measured by a DC four terminal method. It has been found that the resistance per 18 mm of the conductor pattern was as low as only 0.3 mΩ in the thinnest portion of the conductor pattern in which the conductor pattern had a width of 0.1 mm and a cross sectional area of 0.01 mm², Of course, the resistivity of the conductor pattern was as low as desired in the present invention.

2. A nail consisting of a metal rod and a nail head 1.5 mm in diameter formed at the tip of the metal rod was soldered to the conductor pattern having the largest width, i.e., 2 mm. The metal rod was pulled upright so as to determine the bonding strength between the conductor pattern and the aluminum nitride substrate by measuring the tensile load required for peeling the conductor pattern from the aluminum nitride substrate. It has been found that the bonding strength was as high as 14 to 17 kg/cm², which Is of no practical problem.

3. A solder layer was put on a conductor pattern about 5 mm square (conductor pad), which was formed in the central portion of the circuit board. Under this condition, the circuit board was put on a hot plate and heated under an inert gas atmosphere to a temperature higher than the melting point of the solder so as to fuse the solder layer. Then, a semiconductor element was put on the fused solder layer, followed by applying a planar scrubbing to permit the semiconductor element to be sufficiently wetted with the conductor pad of the circuit board so as to achieve soldering without involving bubbles. Further, the circuit board was taken out of the hot plate and cooled to room temperature so as to achieve die bonding of the semiconductor element. Still further, a plurality of electrode pad portions of the die-bonded semiconductor element were connected to a plurality of conductor patterns formed in a width of 0.25 mm on the circuit board and to a plurality of conductor patterns formed in a width of 2 mm on the circuit board by a plurality of aluminum wires by means of an ultrasonic bonder. Finally, a lead terminal was soldered to the edge portion of each of the conductor patterns on the side opposite to the wire connecting portion.

The resultant circuit board having a semiconductor element mounted thereon was subjected to a thermal cycle test ranging between +150° C. and −50° C. It has been found that cracking or peeling which can be recognized by the naked eye observation or microscopic observation was not found at all after the thermal cycle test of 1,000 cycles. Also, the semiconductor element mounted to the circuit board has been found not to give rise to any problem, which is brought about by the heat resistance of the circuit board. Since the circuit board of the present invention comprises a fine conductor pattern excellent in reliability and low in electrical resistance, the present invention permits providing a semiconductor device having a semiconductor element, to which a large current can be supplied, mounted on the circuit board.

EXAMPLES 7 to 9

The surface of a substrate consisting of an aluminum nitride sintered body as in Example 1 was coated with "APR" referred to previously, followed by drying the coating so as to prepare a resist layer. Then, the resist layer was subjected to a light exposure and development using a negative film of a circuit pattern so as to form a groove extending to reach the aluminum nitride substrate. The groove thus formed was found to have a depth of 0.25 mm, a width of 2 mm, 1 mm, 0.5 mm, 0.25 mm, 0.1 mm and a distance between the adjacent grooves of 0.5 mm, 0.25 mm an d0.1 mm. Further, a single groove of 5 mm square was formed in the central portion of the substrate. After formation of the groove, the surface region of the substrate was selectively removed by means of a reactive ion etching with the remaining resist layer used as a mask so as to form a groove having a depth of 0.1 mm. Further, the resist layer was removed, followed by applying a heat treatment under a dry air atmosphere at 1100° C. so as to form an oxide film about 1.0 μm thick on the surface of the substrate including the side wall of the groove.

Figure 4E:
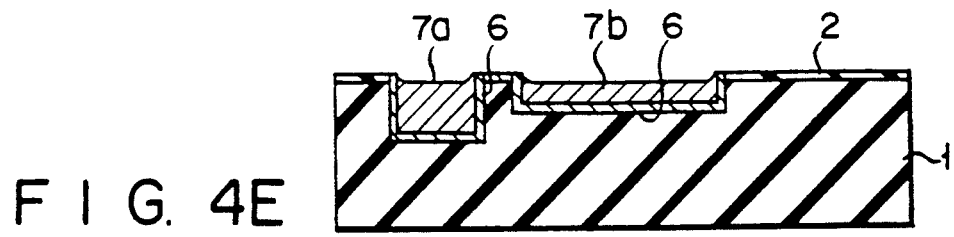
Figure 5:
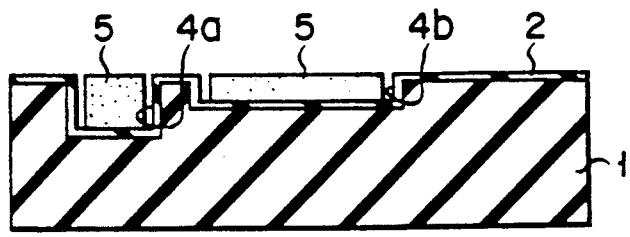
FIG. 5 is a cross sectional view showing the step of loading a paste composition in the method of the present invention for manufacturing a circuit board.
Figure 6:
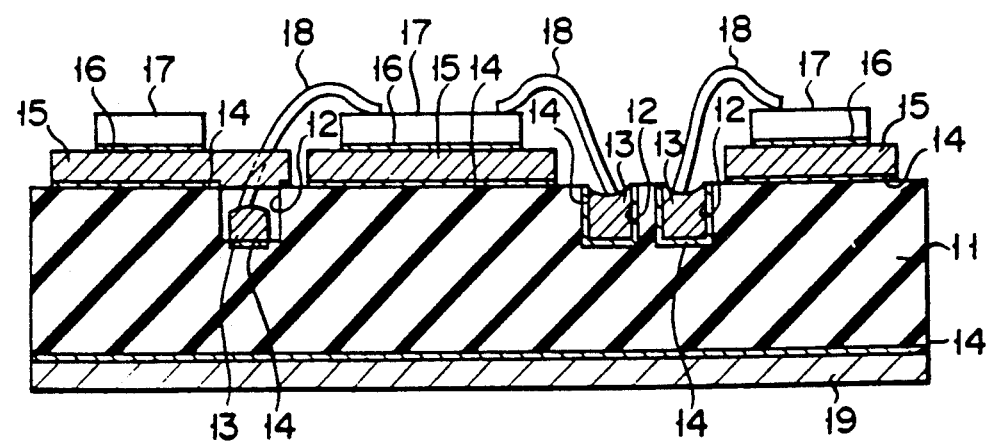
FIG. 6 is a cross sectional view showing how semiconductor elements are mounted to a circuit board manufactured by the method of the present invention.

In the next step, a copper film was deposited at 700° C. under a nitrogen gas atmosphere or vacuum by the thermal migration CVD method using as the raw material gas a mixture consisting of $CuCl_2$, bis acetycetyl acetonate copper (II) complex, bis acety acetonate copper (II) complex and tris acetyl acetonate aluminum (III) complex. Then, the copper film thus deposited was etched back until the substrate surface except for the groove portion was exposed to the outside, followed by applying a heat treatment at 1070° C. for 5 minutes so as to permit the copper film remaining within the groove to be baked to the aluminum nitride substrate. In this fashion, prepared were three kinds of circuit boards. The conductor pattern formed in each of the circuit boards thus manufactured was found to shaped as shown in FIG. 4E and to have a thickness of about 0.05 to 0.1 mm. The conductor pattern was also found to have been formed accurately with a width equal to the width of the groove formed in the previous step. A cross section of the conductor pattern was observed by an electron microscope. Also, the density of the conductor pattern, which was peeled off the substrate, was measured by the Archimedean method. It has been found that the conductor pattern has a relative density of about 97% and fine cells sized at 2 μm or less are dispersed in the conductor pattern.

Evaluation tests given below were applied to 50 circuit boards manufactured as above by the method described above:

1. The electrical resistance of the conductor pattern was measured by a DC four terminal method. It has been found that the resistance per 18 mm of the conductor pattern was as low as only 0.9 to 1.2 mΩ in the thinnest portion of the conductor pattern in which the conductor pattern had a width of 0.1 mm and a cross sectional area of 0.01 mm². Of course, the resistivity of the conductor pattern was as low as desired in the present invention.

2. A nail consisting of a metal rod and a nail head 1.5 mm in diameter formed at the tip of the metal rod was soldered to the conductor pattern having the largest width, i.e., 2 mm. The metal rod was pulled upright so as to determine the bonding strength between the conductor pattern and the aluminum nitride substrate by measuring the tensile load required for peeling the conductor pattern from the aluminum nitride substrate. It has been found that the bonding strength was as high as 14 to 17 kg/cm², which is of no practical problem.

3. A solder layer was put on a conductor pattern about 5 mm square (conductor pad), which was formed in the central portion of the circuit board. Under this condition, the circuit board was put on a hot plate and heated under an inert gas atmosphere to a temperature higher than the melting point of the solder so as to fuse the solder layer. Then, a semiconductor element was put on the fused solder layer, followed by applying a planar scrubbing to permit the semiconductor element to be sufficiently wetted with the conductor pad of the circuit board so as to achieve soldering without involving bubbles. Further, the circuit board was taken out of the hot plate and cooled to room temperature so as to achieve die bonding of the semiconductor element. Still further, a plurality of electrode pad portions of the die-bonded semiconductor element were connected to a plurality of conductor patterns formed in a width of 0.25 mm on the circuit board and to a plurality of conductor patterns formed in a width of 2 mm on the circuit board by a plurality of aluminum wires by means of an ultrasonic bonder. Finally, a lead terminal was soldered to the edge portion of each of the conductor patterns on the side opposite to the wire connecting portion.

The resultant circuit board having a semiconductor element mounted thereon was subjected to a thermal cycle test ranging between +150° C. and −50° C. It has been found that cracking or peeling which can be recognized by the naked eye observation or microscopic observation was not found at all after the thermal cycle test of 1,000 cycles. Also, the semiconductor element mounted to the circuit board has been found not to give rise to problem, which is brought about by the heat resistance of the circuit board. Since the circuit board of the present invention comprises a fine conductor pattern excellent in reliability and low in electrical resistance, the present invention permits providing a semiconductor device having a semiconductor element, to which a large current can be supplied, mounted on the circuit board.

As described above in detail, the present invention provides a method of manufacturing a circuit board of a high performance, high density and high reliability, which comprises a conductor pattern of a high density having a very low resistivity ranging between $1.7 \times 10^{-6}$ Ω·cm, or most $1 \times 10^{-5}$ Ω·cm. The low resistivity of the conductor pattern permits conducting a large electric current to the semiconductor element mounted to the circuit board. What should also be noted is that the thermal expansion coefficient of the conductor pattern is close to that of the insulating substrate, making it possible to prevent a problem derived from the difference in the thermal expansion coefficient between the conductor pattern and the insulating substrate. To be more specific, it is possible to prevent cracking or the like, which is caused in the vicinity of the bonding interface by the thermal stress derived from the difference in the thermal expansion coefficient noted above.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a circuit board, comprising the steps of:

forming an insulating substrate, a surface of which is provided with a groove shaped like a conductor pattern to be formed later; and forming a conductor pattern in said groove, said conductor pattern containing as a main component an electrically conductive metal selected from the group consisting of copper, silver and gold and either fine particle shaving a thermal expansion coefficient smaller than that of said electrically conductive metal or cells.

2. The method according to claim 1, wherein said conductor pattern is formed by means of a CVD method using a gas comprising said electrically conductive metal.

3. A method of manufacturing a circuit board, comprising the steps of:

forming a layer on an insulating substrate, said layer being provided with a groove shaped like a conductor pattern which is to be formed later;

filling the groove of said layer with a paste composition consisting of a powdery material capable of forming an electrically conductive metal selected from the group consisting of copper, silver and gold, fine particles having a thermal expansion coefficient smaller than that of the electrically conductive metal, and an organic binder; and baking the paste composition so as to form a conductor pattern in the groove formed in the insulating substrate, said conductor pattern containing as a main component the electrically conductive metal and the fine particles having a thermal expansion coefficient smaller than that of the metal, said fine particles being dispersed in the electrically conductive metal.

4. The method according to claim 3, wherein said insulating substrate is formed of an aluminum nitride sintered body.

5. The method according to claim 3, wherein said groove has a depth of at least 20 $\mu$m.

6. The method according to claim 1, wherein said insulating substrate is covered in advance with a copper foil by a direct bonding copper method.

7. The method according to claim 3, wherein said fine particles consist of ceramic materials selected from the group consisting of aluminum nitride, silicon carbide, cubic boron nitride, silicon nitirde, boron phosphide, berrylia and alumina.

8. The method according to claim 3, wherein the amount of said fine particles falls within a range of between 0.5 and 20% by volume based on the amount of said electrically conductive metal.

9. The method according to claim 3 wherein said baking step is carried out under a reducing atmosphere.

10. A method of manufacturing a circuit board, comprising the steps of:

forming an insulating substrate, a surface region of said substrate being provided with a groove shaped like a conductor pattern which is to be formed later;

filling the groove of said substrate with a paste composition consisting of a powdery material capable of forming an electrically conductive metal selected from the group consisting of copper, silver and gold, fine particles having a thermal expansion coefficient smaller than that of the electrically conductive metal, and an organic binder; and baking the paste composition so as to form a conductor pattern in the groove formed in the insulating substrate, said conductor pattern containing as a main component the electrically conductive metal and the fine particles having a thermal expansion coefficient smaller than that of the metal, said fine particles being dispersed in the electrically conductive metal.

11. The method according to claim 10, wherein said insulating substrate is formed of an aluminum nitride sintered body.

12. The method according to claim 10, wherein said groove has a depth of at least 20 $\mu$m.

13. The method according to claim 10, wherein said insulating substrate is covered in advance with a copper foil by a direct bonding copper method.

14. The method according to claim 10, wherein said fine particles consist of ceramic materials selected from the group consisting of aluminum nitride, silicon carbide, cubic boron nitride, silicon nitride, boron phosphide, berrylia and alumina.

15. The method according to claim 10, wherein the amount of said fine particles falls within a range of between 0.5 and 20% by volume based on the amount of said electrically conductive metal.

16. The method according to claim 10 wherein said baking step is carried out under a reducing atmosphere.

* * * * *